(12) United States Patent
Xiao et al.

(10) Patent No.: US 10,553,670 B2
(45) Date of Patent: Feb. 4, 2020

(54) PIXEL CIRCUIT STRUCTURE AND DISPLAY DEVICE USING THE SAME

(71) Applicant: BOE TECHNOLOGY GROUP CO., LTD., Beijing (CN)

(72) Inventors: Li Xiao, Beijing (CN); Minghua Xuan, Beijing (CN); Xiaochuan Chen, Beijing (CN); Shengji Yang, Beijing (CN); Dongni Liu, Beijing (CN); Jie Fu, Beijing (CN); Lei Wang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/301,759

(22) PCT Filed: Mar. 8, 2018

(86) PCT No.: PCT/CN2018/078478
§ 371 (c)(1),
(2) Date: Nov. 15, 2018

(87) PCT Pub. No.: WO2018/201796
PCT Pub. Date: Nov. 8, 2018

(65) Prior Publication Data
US 2019/0288056 A1    Sep. 19, 2019

(30) Foreign Application Priority Data

May 4, 2017    (CN) .......................... 2017 1 0309568

(51) Int. Cl.
*H01L 27/32*    (2006.01)
(52) U.S. Cl.
CPC ...... *H01L 27/3279* (2013.01); *H01L 27/3262* (2013.01); *H01L 27/3272* (2013.01)

(58) Field of Classification Search
None
See application file for complete search history.

(56) References Cited

U.S. PATENT DOCUMENTS

| 8,513,879 B2 | 8/2013 | Tamonoki et al. |
| 9,331,101 B2 | 5/2016 | Park et al. |

(Continued)

FOREIGN PATENT DOCUMENTS

| CN | 101800239 A | 8/2010 |
| CN | 104465675 A | 3/2015 |

(Continued)

OTHER PUBLICATIONS

Search Report and Written Opinion for International Application No. PCT/CN2018/078478 dated May 22, 2018.

(Continued)

*Primary Examiner* — Jack S Chen
(74) *Attorney, Agent, or Firm* — Calfee, Halter & Griswold LLP

(57) ABSTRACT

The present disclosure provides a pixel circuit structure and a display device using the same. The pixel circuit structure includes: a metal light shielding layer; at least one buffer layer formed on the metal light shielding layer; a thin film transistor formed on the at least one buffer layer; an insulating layer formed on a gate of the thin film transistor; and a second gate, formed on the insulating layer, forming a storage capacitance with the gate, and electrically coupled to a power line of the thin film transistor, wherein the metal light shielding layer is electrically coupled to the power line of the thin film transistor.

17 Claims, 2 Drawing Sheets

(56) References Cited

U.S. PATENT DOCUMENTS

| | | |
|---|---|---|
| 9,455,309 B2 | 9/2016 | Choi et al. |
| 9,461,200 B2 | 10/2016 | Tamonoki et al. |
| 9,484,395 B2 | 11/2016 | Park et al. |
| 9,608,051 B2 | 3/2017 | Tamonoki et al. |
| 9,786,728 B2 | 10/2017 | Choi et al. |
| 9,954,046 B2 | 4/2018 | Tamonoki et al. |
| 2010/0201262 A1 | 8/2010 | Tamonoki et al. |
| 2013/0328072 A1 | 12/2013 | Tamonoki et al. |
| 2016/0035811 A1 | 2/2016 | Choi et al. |
| 2016/0071888 A1 | 3/2016 | Park et al. |
| 2016/0218163 A1 | 7/2016 | Park et al. |
| 2016/0358994 A1 | 12/2016 | Tamonoki et al. |
| 2017/0012097 A1 | 1/2017 | Choi et al. |
| 2017/0141174 A1 | 5/2017 | Tamonoki et al. |
| 2019/0251318 A1* | 8/2019 | Jung .................. G06K 9/0002 |

FOREIGN PATENT DOCUMENTS

| | | |
|---|---|---|
| CN | 105789244 A | 7/2016 |
| CN | 107093618 A | 8/2017 |
| EP | 2216822 A2 | 8/2010 |
| EP | 2216822 A3 | 12/2012 |
| EP | 2980853 A2 | 2/2016 |
| EP | 2980853 A3 | 2/2016 |
| EP | 2216822 B1 | 5/2017 |

OTHER PUBLICATIONS

Second Office Action for Chinese Patent Application No. 201710309568.5 dated Aug. 12, 2019.

\* cited by examiner

PIXEL CIRCUIT STRUCTURE AND DISPLAY DEVICE USING THE SAME

CROSS-REFERENCE TO RELATED APPLICATIONS

The present application is based upon International Application No. PCT/CN2018/078478, filed on Mar. 8, 2018, which claims priority to Chinese Patent Application No. 201710309568.5, filed on May 4, 2017, and the entire contents thereof are incorporated herein by reference.

TECHNICAL FIELD

The present disclosure relates to the field of display technologies, and in particular, to a pixel circuit structure and a display device using the same.

BACKGROUND

An Organic Light-Emitting Diode (OLED) is a display lighting technology that has been developed in recent years. Especially in the display industry, it is one of the hotspots in the field of flat panel display research. Compared with a liquid crystal display, it has advantages such as high response, high contrast, flexibility, low power consumption, low production cost, self-illumination, wide viewing angle and fast response. At the present, in the display field, such as in mobile phones, PDAs, digital cameras and the like, the OLEDs have begun to replace traditional LCD screens. It is considered to have broad application prospects and important research significance. In particular, top-emitting OLED devices are being studied actively due to their advantages such as higher aperture ratio and light extraction optimization using micro-cavity.

Unlike TFT-LCDs, which use a stable voltage to control brightness, the OLEDs are current-driven and require a stable current to control illumination. The OLEDs are typically made of low-temperature poly-silicon (LTPS). When the OLEDS are used in medium and large-sized high-PPI panels, the load of a small-sized panel will be increased manyfold, and as the pitch between pixels becomes smaller, part of the storage capacitance (Cst) will be sacrificed, which will greatly degrade the display performance.

In the medium-sized high-PPI panel design, a small-sized and low-resolution panel has a large RC load (and therefore a large resistive voltage drop), which will cause a serious IR voltage drop of VDD (that is, power line of a thin-film transistor) and Vdata (that is, a display data line or display signal line) in the LTPS OLED process, resulting in greatly degrading the panel display performance. At the same time, in high-PPI panels, the pixel size is getting smaller and smaller, the width of the signal line is larger due to the limiting by the process conditions, and thus part of the Cst is sacrificed to ensure the arrangement of the pixel circuit structure. In order to reduce the resistance load and increase the Cst, it is necessary to make change using methods such as increasing masks or changing material and so on, which will greatly increase process steps and product costs.

Therefore, the technical problem that needs to be solved urgently is to design a new pixel circuit structure and a display device using the same.

The above information partly disclosed in this background section is only for enhancement of understanding of the background of the present disclosure, and thus it may include information that does not constitute the prior art known to those ordinary skilled in the art.

SUMMARY

The present disclosure is to provide a pixel circuit structure and a display device using the same.

According to a first aspect of the present disclosure, there is provided a pixel circuit structure, including: a metal light shielding layer; at least one buffer layer formed on the metal light shielding layer; a thin film transistor formed on the at least one buffer layer; an insulating layer formed on a gate of the thin film transistor; and a second gate formed on the insulating layer, forming a storage capacitance with the gate, and electrically coupled to a power line of the thin film transistor, wherein the metal light shielding layer is electrically coupled to the power line of the thin film transistor.

In an exemplary embodiment of the present disclosure, the metal light shielding layer is electrically coupled to the power line of the thin film transistor through a via-hole.

In an exemplary embodiment of the present disclosure, the metal light shielding layer is further electrically coupled to a display data line, wherein the metal light shielding layer comprises at least two patterns electrically insulated from each other, and in the metal light shielding layer, a pattern electrically coupled to the display data line is different from a pattern electrically coupled to the power line of the thin film transistor.

In an exemplary embodiment of the present disclosure, the metal light shielding layer is electrically coupled to the display data line through a via-hole.

In an exemplary embodiment of the present disclosure, the via-hole is located at a cross of a projection of the power line of the thin film transistor or the display date line on the metal light shielding layer with the metal light shielding layer.

In an exemplary embodiment of the present disclosure, the thin film transistor is a low temperature poly-silicon thin film transistor.

In an exemplary embodiment of the present disclosure, the pixel circuit structure is used for an organic electroluminescence display device.

According to a second aspect of the present disclosure, there is provided a display device, including: the pixel circuit structure according to any one of the above described; and a display element formed on the pixel circuit structure.

In an exemplary embodiment of the present disclosure, the display element includes: a pixel electrode formed on the pixel circuit structure; a light emitting layer formed on the pixel electrode; and a top electrode formed on the light emitting layer.

In an exemplary embodiment of the present disclosure, the light emitting layer is an organic light emitting layer.

It should be understood that the above general description and the following detailed description are merely exemplary and explanatory and are not intended to limit the present disclosure.

BRIEF DESCRIPTION OF THE DRAWINGS

By describing the exemplary embodiments in details with reference to the drawings, the above and other objects, features and advantages of the present disclosure will become more apparent.

The drawings herein incorporated into the specification and forming part of the specification, illustrate the embodiments of the present disclosure, and are used together with the description to explain the principles of the present disclosure. It is apparent that the drawings in the following description are only some of the embodiments of the present disclosure, and other drawings may be obtained from these drawings by those skilled in the art without creative labor.

DETAILED DESCRIPTION

Figure 1:
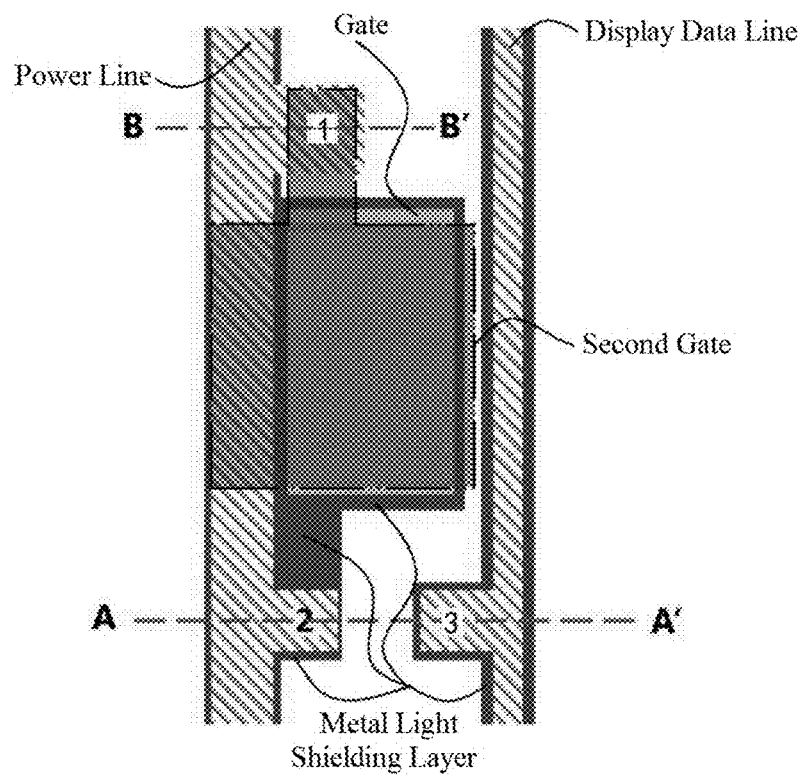
FIG. 1 illustrates a top view of a pixel circuit structure in accordance with an exemplary embodiment of the present disclosure.

Exemplary embodiments will now be described more fully with reference to the drawings. However, the exemplary embodiments can be implemented in a variety of forms, and should not be construed as being limited to the examples set forth herein; the described features, structures, or characteristics may be combined in any suitable manner in one or more embodiments. In the following description, numerous specific details are set forth to provide a full understanding of the embodiments of the present disclosure. However, one skilled in the art will appreciate that the technical solutions of the present disclosure can be practiced when one or more of the described specific details are omitted or other methods, components, devices, steps, etc. are employed.

It is necessary to point out that in the drawings, the dimensions of layers and regions may be exaggerated for clarity of illustration. It is also understood that when an element or layer is referred to as "on" another element or layer, it may be directly on the other element or an intermediate layer may be present. In addition, it can be understood that when an element or layer is referred to as being "under" another element or layer, it may be directly under the other element or one or more intermediate layers or elements may be present. In addition, it can also be understood that when a layer or element is referred to as being "between" two layers or elements, it can be an only layer between the two layers or elements, or one or more intermediate layers or components may be present. Similar reference numerals indicate similar components throughout.

The present disclosure provides a pixel circuit structure and a display device using the same. The pixel circuit structure includes: a metal light shielding layer; at least one buffer layer formed on the metal light shielding layer; a thin film transistor (that is, TFT) formed on the at least one buffer layer; an insulating layer formed on a gate of the thin film transistor; a second gate formed on the insulating layer, forming a storage capacitance with the gate, and electrically coupled to a power line of the thin film transistor; wherein the metal light shielding layer is electrically coupled to a power line (that is, a so-called VDD line, providing an operating voltage for the thin film transistor) of the thin film transistor. The metal light shielding layer is electrically coupled to the power line of the thin film transistor so that the metal light shielding layer is coupled to the power line in parallel, therefore, the resistance of the power line, the load of the panel and IR drop are reduced, and at the same time, the storage capacitance Cst is increased. In addition, the metal light shielding layer is electrically coupled to the display data line so that the metal light shielding layer can also be coupled to the display data line in parallel, therefore, the resistance of the data line, the load of the panel and the IR drop are reduced.

Figure 2:
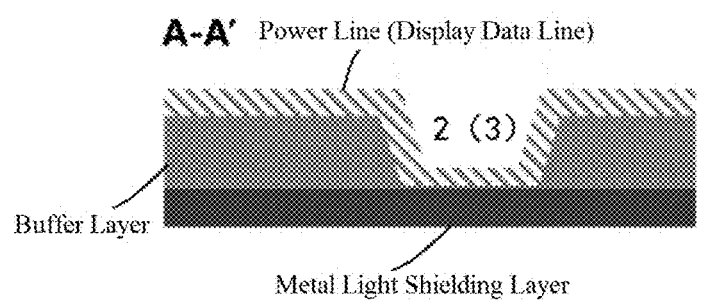
FIG. 2 illustrates a cross-sectional view of a pixel circuit structure in accordance with an exemplary embodiment of the present disclosure.
Figure 2:
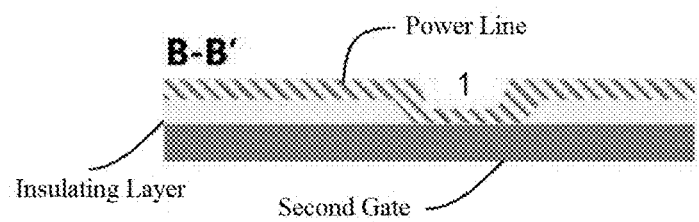
Figure 3:
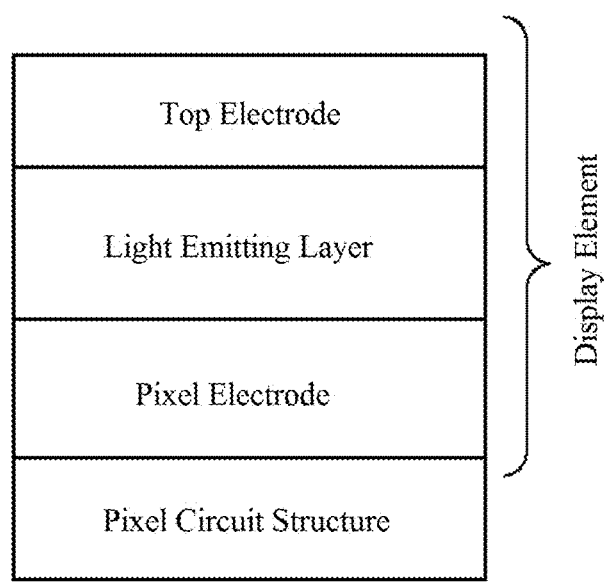
FIG. 3 illustrates a schematic diagram of a display device using a pixel circuit structure in accordance with an exemplary embodiment of the present disclosure.

The pixel circuit structure and a display device using the same of the present disclosure are specifically described below with reference to the drawings, wherein FIG. 1 illustrates a top view of a pixel circuit structure according to an exemplary embodiment of the present disclosure; FIG. 2 illustrates a cross-sectional view of a pixel circuit structure in accordance with an exemplary embodiment of the present disclosure; and FIG. 3 illustrates a schematic view of a display device including a pixel circuit structure in accordance with an exemplary embodiment of the present disclosure.

First, the pixel circuit structure will be described in detail in conjunction with FIGS. 1-2.

FIG. 1 illustrates a top view of a pixel circuit structure in accordance with an exemplary embodiment of the present disclosure; and FIG. 2 illustrates a cross-sectional view of a pixel circuit structure in accordance with an exemplary embodiment of the present disclosure. The pixel circuit structure can be applied to the manufacturing of a display device using a low temperature poly-silicon (LTPS) process so that an IP drop can be reduced and a storage capacitance can be increased, and at the same time, light emission can be controlled with stable current. However, the present disclosure is not limited thereto, and the pixel circuit structure may also be applied to the manufacturing of a display device using other TFT processes. The display device may be an organic electroluminescent display device, that is, an OLED device, but the present disclosure is not limited thereto, and the display device may be other types of display devices.

As shown in FIG. 1, the pixel circuit structure includes: a metal light shielding layer; at least one buffer layer formed on the metal light shielding layer; a thin film transistor, that is, a TFT (only gate of the thin film transistor is shown in FIG. 1 as a top view), formed on the at least one buffer layer; an insulating layer formed on the gate of the thin film transistor; a second gate formed on the insulating layer, forming a storage capacitance with the gate, and electrically coupled to a power line (that is, a so-called VDD line, providing an operating voltage for the thin film transistor) of the thin film transistor; wherein the metal light shielding layer is electrically coupled to a power line of the thin film transistor. The metal light shielding layer is electrically coupled to the power line of the thin film transistor so that the metal light shielding layer is coupled to the power line in parallel, therefore, the resistance of the power line, the load of the panel and IR drop are reduced, and at the same time, the storage capacitance Cst is increased.

In an exemplary embodiment of the present disclosure, the metal light shielding layer is electrically coupled to the power line of the thin film transistor through a via-hole. Since the metal light shielding layer is electrically coupled to the power line of the thin film transistor through the via-hole, a metal layer structure of the existing process can be used without an additional metal layer, therefore, the IR drop can be reduced and the storage capacitance can be increased without changing the original process flow and increasing the cost. However, the present disclosure is not limited thereto, and the metal light shielding layer may be electrically coupled to the power line of the thin film transistor in other manners, which may also reduce the IR drop and increase the storage capacitance.

FIG. 2 is a cross-sectional view taken along the directions A-A' and B-B' in the top view of the pixel circuit structure shown in FIG. 1.

As shown in the cross-sectional view taken along the A-A' direction in FIG. 2, the power line is electrically coupled to the metal light shielding layer through a via-hole 2 passing through the buffer layer.

Similarly, the second gate may be electrically coupled to the power line of the thin film transistor through a via-hole. As shown in the cross-sectional view taken along the B-B' direction in FIG. 2, the power line is electrically coupled to the second gate through a via-hole 1 passing through the insulating layer. However, the present disclosure is not limited thereto, and the second gate may be electrically coupled to the power line of the thin film transistor in other manners.

In an exemplary embodiment of the present disclosure, the metal light shielding layer is further electrically coupled to the display data line. The metal light shielding layer includes at least two patterns electrically insulated from each other, and in the metal light shielding layer, the pattern electrically coupled to the metal light shielding layer is different from the pattern electrically coupled to the power line of the thin film transistor.

There may be a plurality of patterns in the metal light shielding layer that are electrically coupled to the power line of the thin film transistor, and also, there may be a plurality of patterns in the metal light shielding layer that are electrically coupled to the display data line, as long as the pattern electrically coupled to the display data line is insulated from the pattern electrically coupled to the power line of the thin film transistor.

The metal light shielding layer is electrically coupled to the display data line so that the metal light shielding layer may be coupled to the display data line in parallel, therefore the resistance of the data line, the load of the panel and the IR drop may be reduced.

In an exemplary embodiment of the present disclosure, the metal light shielding layer is electrically coupled to the display data line through a via-hole. As shown in the cross-sectional view taken along the A-A' direction in FIG. 2, the display data line is electrically coupled to the metal light shielding layer through a via-hole 3 passing through the buffer layer. However, the present disclosure is not limited thereto, and the metal light shielding layer may be electrically coupled to the display data line in other manners.

In an exemplary embodiment of the present disclosure, the via-hole is located at a cross of a projection of the power line of the thin film transistor or the display date line on the metal light shielding layer with the metal light shielding layer (that shown at the via-holes 1-3 in FIGS. 1 and 2).

In an exemplary embodiment of the present disclosure, the thin film transistor is a low temperature poly-silicon thin film transistor, that is, an LTPS-TFT. However, the present disclosure is not limited thereto, and the thin film transistor may be other types of TFTs.

In an exemplary embodiment of the present disclosure, the pixel circuit structure is used for an organic electroluminescence display device. However, the present disclosure is not limited thereto, and the pixel circuit structure can also be applied to other types of display devices such as liquid crystal displays, inorganic electroluminescence displays, and the like.

It should be specially pointed out herein that there are many implementations of the drive circuit structure for the current-driven TFT pixel circuit, and the reported current-driven circuits so far mainly include a TFT structure with three transistors, a TFT structure with four transistors, a TFT structure with five transistors and a TFT structure with more transistors. No matter which kind of current-driven circuit is used, as long as the metal light shielding layer is electrically coupled to the power line of the thin film transistor and/or the metal light-shielding layer is electrically coupled to the display data line, the resistance of the power line, the load of the panel and IR drop may be reduced, and at the same time, the storage capacitance Cst may be increased, and/or the resistance of the data line, the load of the panel and the IR drop may be reduced, which is irrelevant to the number of the transistors in the TFT structure.

A display device using the pixel circuit structure described in the above embodiment will be described in detail below with reference to FIG. 3.

FIG. 3 illustrates a schematic diagram of a display device using a pixel circuit structure in accordance with an exemplary embodiment of the present disclosure. The display device may be a display device manufactured by using a low-temperature poly-silicon process to ensure that the IR drop may be reduced and the storage capacitance may be increased while obtaining a stable current to control the light emission, but the present disclosure is not limited thereto, and the display device may be a display device manufactured by other TFT processes. In addition, the display device may be an organic electroluminescence display device, that is, an OLED device, but the present disclosure is not limited thereto, and other types of display devices may be used.

As shown in FIG. 3, a display device includes: a pixel circuit structure according to the above embodiments; and a display element formed on the pixel circuit structure.

The pixel circuit structure at least includes: a metal light shielding layer; at least one buffer layer formed on the metal light shielding layer; a thin film transistor (only gate of the thin film transistor is shown in FIG. 1 as a top view) formed on the at least one buffer layer; an insulating layer formed on the gate of the thin film transistor; a second gate formed on the insulating layer, forming a storage capacitance with the gate, and electrically coupled to a power line of the thin film transistor; wherein the metal light shielding layer is electrically coupled to a power line of the thin film transistor. The metal light shielding layer is electrically coupled to the power line of the thin film transistor so that the metal light shielding layer is coupled to the power line in parallel, therefore, the resistance of the power line, the load of the panel and IR drop are reduced, and at the same time, the storage capacitance Cst is increased.

The display element includes: a pixel electrode formed on the pixel circuit structure, a source of the thin film transistor being electrically coupled to the pixel electrode to apply a driving current to the display element to cause the display element to emit light; a light emitting layer formed on the pixel electrode; and a top electrode formed on the light emitting layer.

The top electrode is a light-emitting surface, and is usually a transparent electrode having a high light transmittance. The commonly used transparent electrode is indium tin oxide, that is, ITO and so on.

In an exemplary embodiment of the present disclosure, the light emitting layer is an organic light emitting layer.

In the display device using the pixel circuit structure described in the foregoing embodiment, an effect that the IR drop may be reduced and the storage capacitance may be increased while stable current may be obtained to control light emission can be achieved.

In summary, according to some embodiments of the present disclosure, the metal light shielding layer is electrically coupled to the power line of the thin film transistor so that the metal light shielding layer is coupled to the power line in parallel, therefore, the resistance of the power line, the load of the panel and IR drop are reduced, and at the same time, the storage capacitance is increased.

According to some embodiments of the present disclosure, the metal light shielding layer is electrically coupled to the display data line so that the metal light shielding layer is coupled to the display data line in parallel, therefore, the resistance of the data line, the load of the panel and the IR drop are reduced.

According to some embodiments of the present disclosure, since the metal light shielding layer is electrically coupled to the power line of the thin film transistor and/or the display data line through the via-hole, a metal layer structure of the existing process can be used without an additional metal layer, therefore, the IR drop can be reduced and the storage capacitance can be increased without changing the original process flow and increasing the cost.

Other embodiments of the present disclosure will be readily apparent to those skilled in the art upon consideration of the specification and practice of the present disclosure disclosed herein. The present application is intended to cover any variations, uses, or adaptations of the present disclosure, which are in accordance with the general principles of the present disclosure and include common knowledge or conventional technical means in the art that are not disclosed in the present disclosure. The specification and examples are to be considered as illustrative only, the true scope and spirit of the disclosure is pointed out by the following claims.

It is to be understood that the present disclosure is not limited to the precise structures shown and described in the drawings, and various modifications and changes can be made without departing from the scope thereof. The scope of the present disclosure is limited only by the appended claims.

What is claimed is:

1. A pixel circuit structure, comprising:
   a metal light shielding layer;
   at least one buffer layer formed on the metal light shielding layer;
   a thin film transistor formed on the at least one buffer layer;
   an insulating layer formed on a gate of the thin film transistor; and
   a second gate, formed on the insulating layer, forming a storage capacitance with the gate, and electrically coupled to a power line of the thin film transistor,
   wherein the metal light shielding layer is electrically coupled to the power line of the thin film transistor.

2. The pixel circuit structure according to claim 1, wherein the metal light shielding layer is electrically coupled to the power line of the thin film transistor through a via-hole.

3. The pixel circuit structure according to claim 1, wherein the metal light shielding layer is further electrically coupled to a display data line, wherein the metal light shielding layer comprises at least two patterns electrically insulated from each other, and in the metal light shielding layer, a pattern electrically coupled to the display data line is different from a pattern electrically coupled to the power line of the thin film transistor.

4. The pixel circuit structure according to claim 3, wherein the metal light shielding layer is electrically coupled to the display data line through a via-hole.

5. The pixel circuit structure according to claim 2, wherein the via-hole is located at a cross of a projection of the power line of the thin film transistor on the metal light shielding layer with the metal light shielding layer.

6. The pixel circuit structure according to claim 4, wherein the via-hole is located at a cross of a projection of the display data line on the metal light shielding layer with the metal light shielding layer.

7. The pixel circuit structure according to claim 1, wherein the thin film transistor is a low temperature poly-silicon thin film transistor.

8. The pixel circuit structure according to claim 1, wherein the pixel circuit structure is used for an organic electroluminescence display device.

9. A display device, comprising:
   a pixel circuit structure; and
   a display element formed on the pixel circuit structure,
   wherein the pixel circuit structure comprises:
   a metal light shielding layer;
   at least one buffer layer formed on the metal light shielding layer;
   a thin film transistor formed on the at least one buffer layer;
   an insulating layer formed on a gate of the thin film transistor; and
   a second gate, formed on the insulating layer, forming a storage capacitance with the gate, and electrically coupled to a power line of the thin film transistor,
   wherein the metal light shielding layer is electrically coupled to the power line of the thin film transistor.

10. The display device according to claim 9, wherein the metal light shielding layer is electrically coupled to the power line of the thin film transistor through a via-hole.

11. The display device according to claim 9, wherein the metal light shielding layer is further electrically coupled to a display data line, wherein the metal light shielding layer comprises at least two patterns electrically insulated from each other, and in the metal light shielding layer, a pattern electrically coupled to the display data line is different from a pattern electrically coupled to the power line of the thin film transistor.

12. The display device according to claim 11, wherein the metal light shielding layer is electrically coupled to the display data line through a via-hole.

13. The display device according to claim 10, wherein the via-hole is located at a cross of a projection of the power line of the thin film transistor on the metal light shielding layer with the metal light shielding layer.

14. The display device according to claim 12, wherein the via-hole is located at a cross of a projection of the display data line on the metal light shielding layer with the metal light shielding layer.

15. The display device according to claim 9, wherein the thin film transistor is a low temperature poly-silicon thin film transistor.

16. The display device according to claim 9, wherein the display element comprises:
   a pixel electrode formed on the pixel circuit structure;
   a light emitting layer formed on the pixel electrode; and
   a top electrode formed on the light emitting layer.

17. The display device according to claim 16, wherein the light emitting layer is an organic light emitting layer.

* * * * *